(12) United States Patent
Chang

(10) Patent No.: US 6,794,911 B2
(45) Date of Patent: Sep. 21, 2004

(54) CHARGE-PUMP CIRCUIT FOR CHARGE-SHARE SUPPRESSION

(75) Inventor: Yu-Jen Chang, Ilan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/386,555

(22) Filed: Mar. 13, 2003

(65) Prior Publication Data

US 2003/0218485 A1 Nov. 27, 2003

(30) Foreign Application Priority Data

May 23, 2002 (TW) ........................................ 91110909 A

(51) Int. Cl.[7] .............................................. H03L 7/06
(52) U.S. Cl. ...................................... 327/157; 327/148
(58) Field of Search ................................. 327/157, 148, 327/149, 150, 158, 159; 375/374

(56) References Cited

U.S. PATENT DOCUMENTS 5,801,578 A * 9/1998 Bereza ........................ 327/536
6,255,872 B1 * 7/2001 Harada et al. ............... 327/157
6,586,976 B2 * 7/2003 Yang ........................... 327/157

* cited by examiner

Primary Examiner—Linh M. Nguyen
(74) Attorney, Agent, or Firm—Birch, Stewart, Kolasch & Birch, LLP

(57) ABSTRACT

A charge-pump circuit for charge-share suppression. A first switching element is coupled between a first connecting node and an output terminal. A first load receives a current from a first current source and outputs an output voltage at the output terminal when the first switching element is in "On" state. A status of a second switching element is controlled by the input signal and opposite to the status of the first switching elements A second current source is coupled to the second switching element through a second connecting node. A second load receives the output voltage when the second switching element is in "On" state. A first feedback circuit maintains a constant relation between the output voltage and a voltage of the first node. A second feedback circuit maintains a constant relation between the output voltage and a voltage of the second node.

6 Claims, 17 Drawing Sheets

US 6,794,911 B2

CHARGE-PUMP CIRCUIT FOR CHARGE-SHARE SUPPRESSION

BACKGROUND OF THE INVENTION

1. Field of the Invention

The invention relates to a charge-pump circuit for the PLL (Phase Lock Loop), and more particularly to a feedback charge-share suppressing charge-pump circuit.

2. Description of the Related Art

When generating required system clocks, it is necessary to input referenced clocks in phase lock loops (PLL) or clock synthesizers. FIG. 1 is a block diagram illustrating a conventional phase lock loop system. The phase lock loop system 100 comprises a phase frequency detector 102, a charge-pump circuit 104, a voltage-controlled oscillator 106, a divider 108 and a loop filter 110. The phase lock loop system 100 receives a referenced clock $F_{in}$. The charge-pump circuit 104 drives the voltage-controlled oscillator 106 to generate a required clock $F_{out}$ at a signal generated by the phase frequency detector 102. The required clock $F_{out}$ is fed back to the phase frequency detector 102 through the divider 108. The loop filter 110 is coupled to an output terminal of the charge-pump circuit 104. A detailed diagram of the conventional charge-pump circuit 104 and loop filter 110 is shown in FIG. 2a.

FIG. 2a is a circuit diagram illustrating a conventional charge-pump circuit and loop filter as shown in FIG. 1. As shown in FIG. 2a, the charge-pump circuit 104 comprises current sources 202 and 204, switches 206 and 208, and a capacitor 210. The loop filter 110 is composed of a capacitor 212. The loop filter 110 is coupled to an output terminal of the charge-pump circuit 104. When the switch 206 is in "On" state, the loop filter 110 is charged by the current sources 202. When the switch 208 is in "On" state, the loop filter 110 supplies the stored power to the switch 208 and the current source 204. A charge-share problem occurs in the charge-pump circuit 104. FIG. 2b is a diagram illustrating the charge-share problem in the charge-pump circuit shown in FIG. 2a. The X axis is time, in units of seconds (s). The Y axis is the output voltage Vc, in units of volts (V). Line 22 shows a normal voltage curve. Dotted line 24 shows a curve of the voltage affected by the charge-share problem when the switch 206 changes from "Off" state to "On" state. Because of the charge-share problem, the signal driving the controlled oscillator 106 is incorrect. Thus, the phase lock loop system cannot generate the required clock.

To preventing the charge-share problem, Ian A. Young, Jeffrey K. Greason, and Keng L. Wang provide a charge-pump circuit for charge-share suppression with an operational amplifier (referring "A PLL Clock Generator with 5 to 110 MHz of Lock Range for Microprocessors," IEEE J. Solid State Circuits, vol. 27, pp. 1599–1607 November 1992). FIG. 3 is a circuit diagram illustrating the conventional charge-pump circuit for charge-share suppression with the operational amplifier OP1. As shown, when the switches S1 and S4 are in "Off" state and the switches S2 and S3 are in "On" state, through the operational amplifier OP1, the voltage on the node N1 is equal to $V_c$. When the switches S2 and S3 is in "Off" state and the switches S1 and S4 is in "On" state, through the operational amplifier OP1, the voltage on the node N2 is equal to $V_c$. Thus, the charge-share problem does not occur. The disadvantage of this circuit is that the operational amplifier must work in the wide range of the input frequency and respond quickly to all input frequencies. The result of the charge-share suppression in this circuit completely depends upon the operational capacity of the operational amplifier. A fine design of the operational amplifier is preferred to the result of the charge-share suppression. It is difficult to design such an operational amplifier. Thus, the design of the charge-pump circuit becomes more complex.

To overcome the above problem, Hee-Tae Ahn and David J. Allstet provide a charge-pump circuit for charge-share suppression with transistors (referring to Hee-Tae Ahn and David J. Allstet "A Low-Jitter 1.9 V CMOS PLL for UltraSPARC Microprocessor Applications, " IEEE J. Solid-State Circuits, vol. 35, pp. 450–454 March 2000). FIG. 4 is a circuit diagram illustrating the conventional charge-pump circuit for charge-share suppression with the transistors Q1 and Q2. As shown in FIG. 4, when the switch S1 is in "Off" state and the switch S2 is in "On" state, a difference in voltage between a source and a gate of the transistor Q1 is $V_{Q1}$. Thus, the voltage on the node N1 is equal to $V_c+V_{Q1}$. If the voltage depleted in an impedance of the switch S1 in "On" state is $V_{Q1}$, the charge-share problem does not occur. When the switch S2 is in "Off" state and the switch S1 is in "On" state, a voltage between a source and a gate of the transistor Q2 is $V_{Q2}$. Thus, the voltage on the node N2 is equal to $V_c+V_{Q2}$. If the voltage depleted in an impedance of the switch S2 in "On" state is $V_{Q2}$, the charge-share problem does not occur. Therefore, his circuit has many problems. When the switch is in "On" state, there are two current paths, and it is difficult to detect the current through the switch. Thus, the impedance of the switch in "On" state is difficult to determine, to resolve the charge-share problem. Also, when the current through the switch is small, the impedance of the switch in "On" state must be large. However, in the design of the switch, the impedance of the switch in "On" state must be small. The large impedance of the switch in "On" state cannot be implemented in practical circuit. Finally, the large impedance of the switch in "On" state can be influenced by different procedures and environments. Thus, the design the charge-pump circuit becomes more complex.

SUMMARY OF THE INVENTION

An object of the present invention is to provide a charge-pump circuit for charge-share suppression without adding operational amplifiers to decrease the difficulty of design for the charge-pump circuit.

Another object of the present invention is to provide a charge-pump circuit for charge-share suppression with a feedback path to resolve the problems in the conventional charge-pump circuit shown in FIG. 4.

Accordingly, the present invention provides a charge-pump circuit for charge-share suppression comprising a first current source, a first switching element, a first load, a second switching element, a second current source, a second load, a first feedback circuit and a second feedback circuit. The first current source receives a voltage from a voltage generator and provides a current output. The first switching element is coupled between a first connecting node and an output terminal. The first switching element is controlled by an input signal. The first load is coupled between the first switching element and the output terminal. The first load receives the current and outputs an output voltage at the output terminal when the first switching element is in "On" state. The second switching element is controlled by the input signal and opposite to the first switching element. The second current source is coupled between the second switching element and ground and is coupled to the second switching element through a second connecting node. The second load is coupled between the second switching element and the output terminal. The second load receives the output voltage when the second switching element is in "On" state. The first feedback circuit maintains a constant relation between the output voltage and a voltage of the first node, and is not influenced by the status of the first and second switching elements. The second feedback circuit maintains a constant relation between the output voltage and a voltage of the second node, and is not influenced by the status of the first and second switching elements.

DESCRIPTION OF THE DRAWINGS

For a better understanding of the present invention, reference is made to a detailed description to be read in conjunction with the accompanying drawings, in which:

FIG. 2b is a diagram illustrating the charge-share problem occurring in the charge-pump circuit shown in FIG. 2a;

FIG. 6 is a block diagram illustrating a phase lock loop system comprising the charge-pump circuit for charge-share shown in FIG. 5a;

DETAILED DESCRIPTION OF THE INVENTION

Figure 5A:
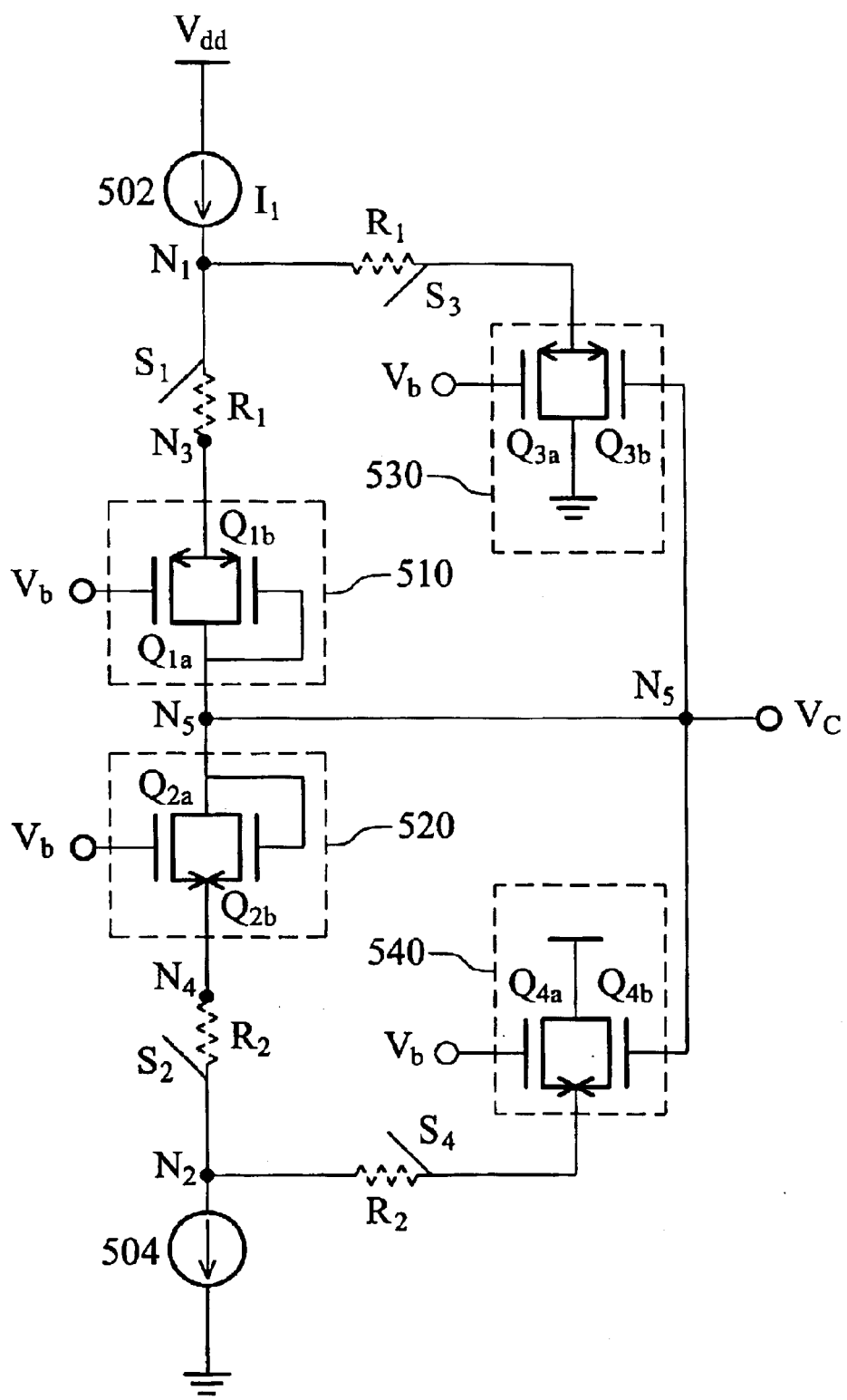
FIG. 5a is a circuit diagram illustrating a charge-pump circuit for charge-share suppression according to the embodiment of the invention.

FIG. 5a is a circuit diagram illustrating a charge-pump circuit for charge-share suppression according to the embodiment of the invention. As shown in FIG. 5a, the charge-pump circuit for charge-share suppression comprises current sources 502 and 504, switch S1–S4, and groups of transistors 510, 520, 530, and 540. A voltage $V_{dd}$ generated from a voltage generator is input to the current source 502. A current $I_1$ is generated from the current source 502. The current source 504 is coupled between the switch S2 and ground. The impedance of the switch S1 in "On" state is the same as that of the switch S3 in "On" state. Therefore, in the embodiment, the switch S1 is the same as the switch S3. The impedance of the switch S2 in "On" state is the same as that of the switch S4 in "On" state. Therefore, in the embodiment, the switch S2 is the same as the switch S4.

Figure 1:
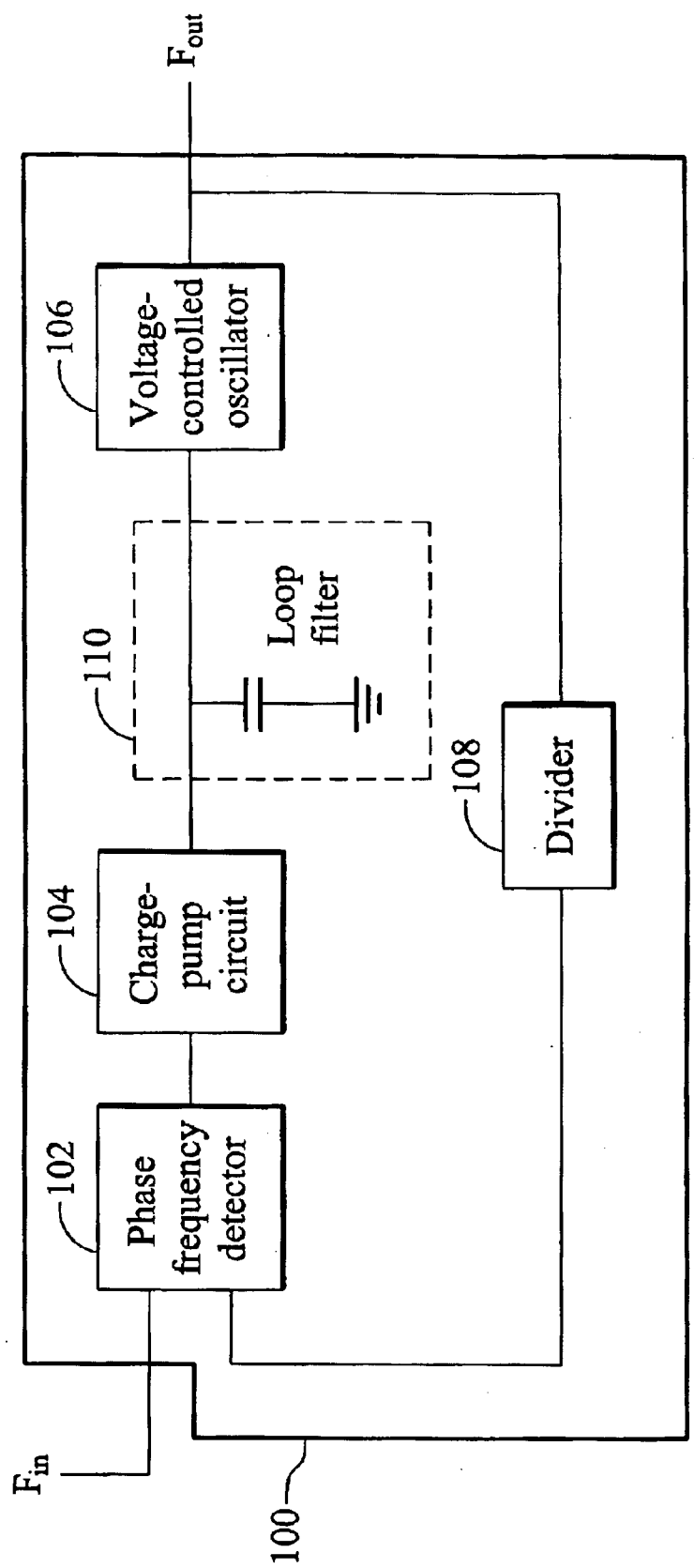
FIG. 1 is a block diagram illustrating a conventional phase lock loop system.
Figure 2A:
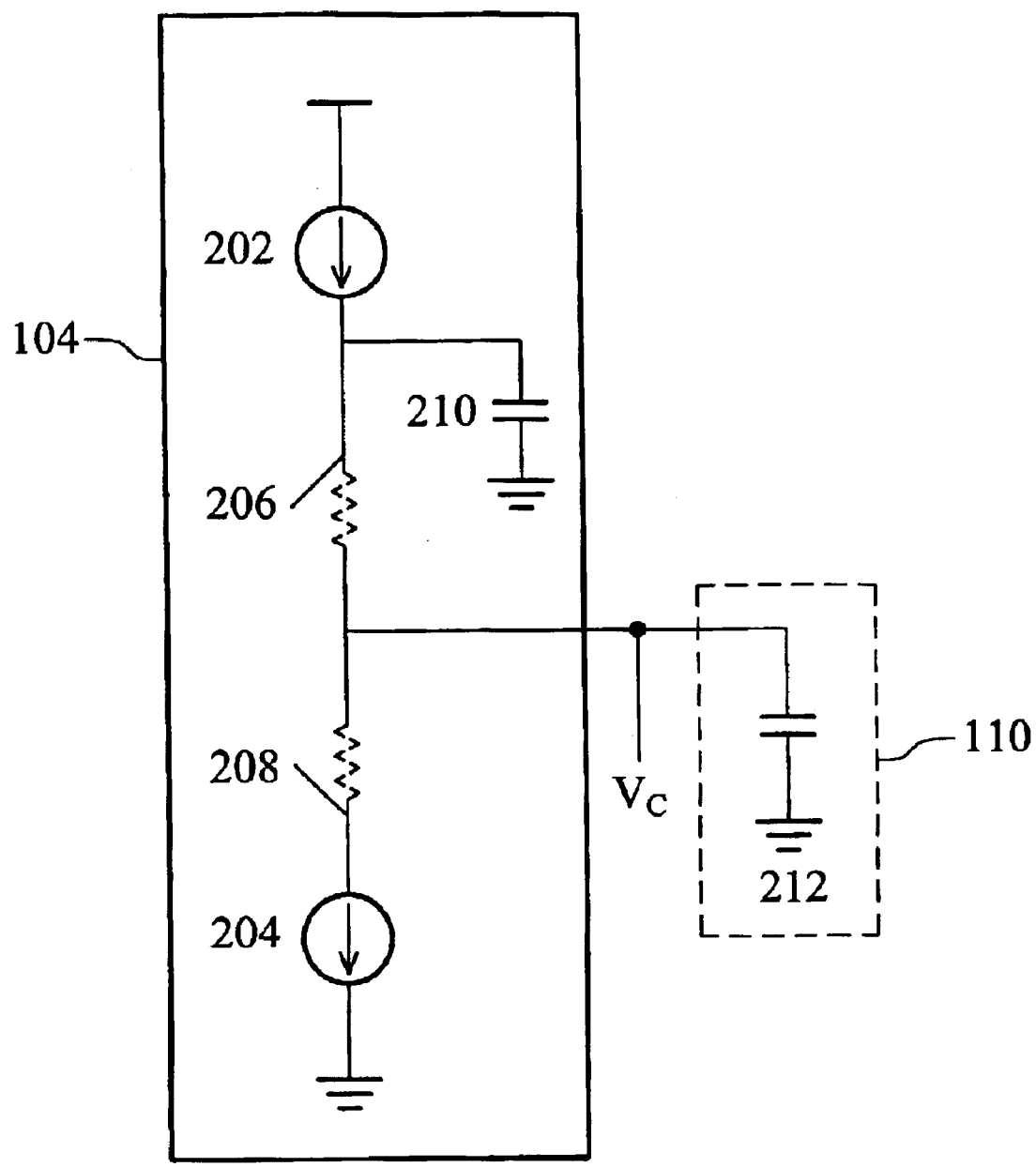
FIG. 2a is a circuit diagram illustrating the conventional charge-pump circuit and the loop filter shown in FIG. 1.
Figure 2B:
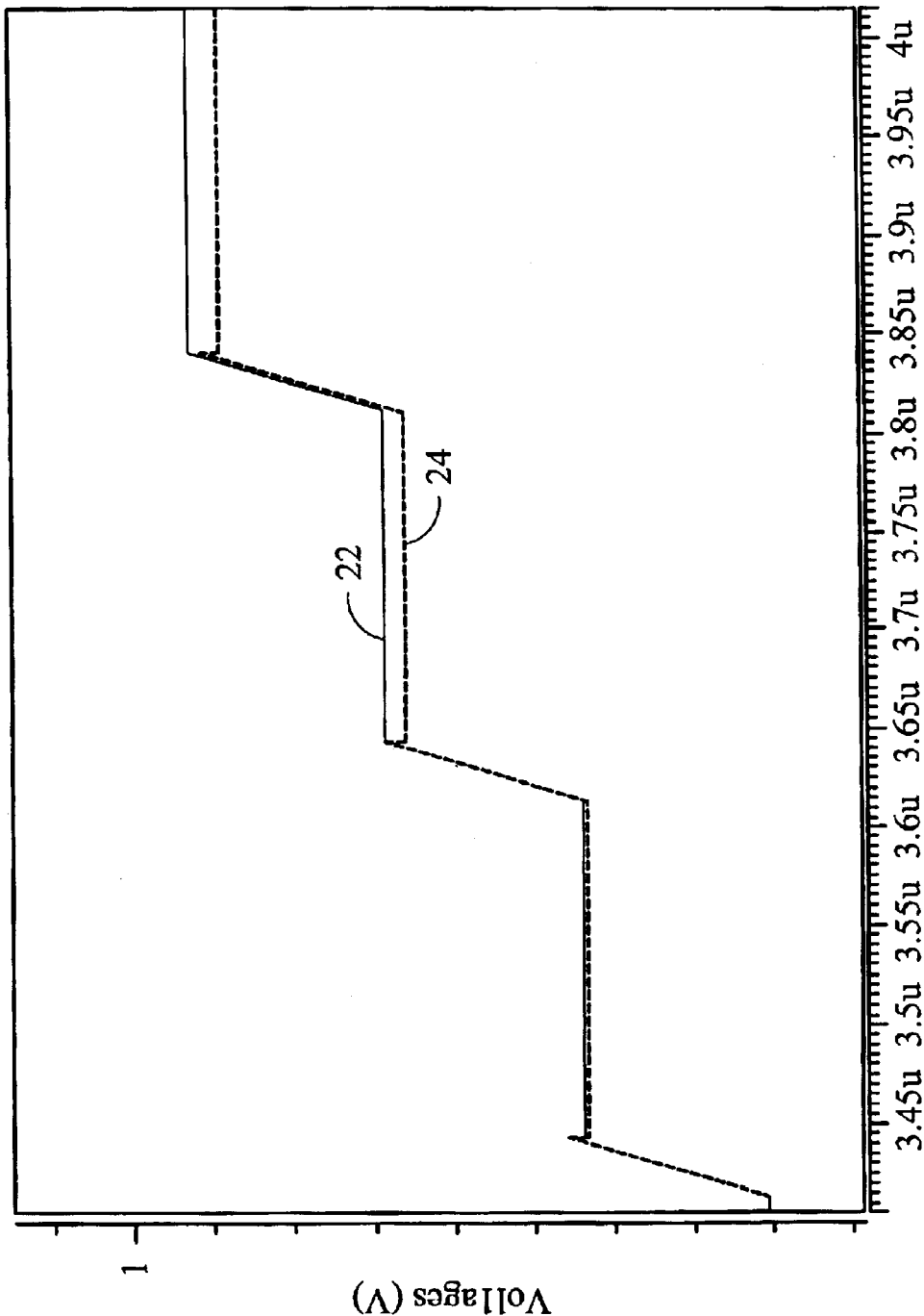

The switches S1–S4 are co-controlled by an input signal (such as the control signal generated by the phase frequency detector shown in FIG. 1). The switch S2 is opposite to the switch S1, such that when the switch S1 is in "On" state, the switch S2 is in "Off" state. The switch S3 is opposite to the switch S1, such that when the switch S1 is in "On" state, the switch S3 is in "Off" state. The switch S4 is the same as the switch S1, such that when the switch S1 is in "On" state, the switch S4 is also in "On" state.

The group of transistors 510 comprises transistors $Q_{1a}$ and $Q_{1b}$. The group of transistors 520 comprises transistors $Q_{2a}$ and $Q_{2b}$. The group of transistors 530 comprises transistors $Q_{3a}$ and $Q_{3b}$. The group of transistors 540 comprises transistors $Q_{4a}$ and $Q_{4b}$. The group of transistors 510 is coupled to the switch S1. When the switch S1 in "On" state, the current generated from the current source 502 and the bias voltage $V_b$ is input to the group of transistors 510. The group of transistors 510 generates an output voltage $V_c$ at an output terminal N5. The group of transistors 520 is coupled to the switch S2. When the switch S2 is "On", the output voltage $V_c$ and the bias voltage $V_b$ are input to the group of transistors 520. The group of transistors 530 is coupled between the switch S3 and the output terminal N5. When the switches S2 and S3 are "On", the output voltage $V_c$ and the bias voltage $V_b$ are input to the group of transistors 530. The components of the group of transistors 530 are the same as the group of transistors 510. Therefore, the transistor $Q_{1a}$ is the same as the transistor $Q_{3a}$ and the transistor $Q_{1b}$ is the same as the transistor $Q_{3b}$. The group of transistors 540 is coupled between the switch S4 and the output terminal N5. When the switches S1 and S4 are "On, the output voltage $V_c$ and the bias voltage $V_b$ are input to the group of transistors 540. The components of the group of transistors 540 is the same as the components of the group of transistors 520. Therefore, the transistor $Q_{2a}$ is the same as the transistor $Q_{4a}$ and the transistor $Q_{2b}$ is the same as the transistor $Q_{4b}$.

Figure 5B:
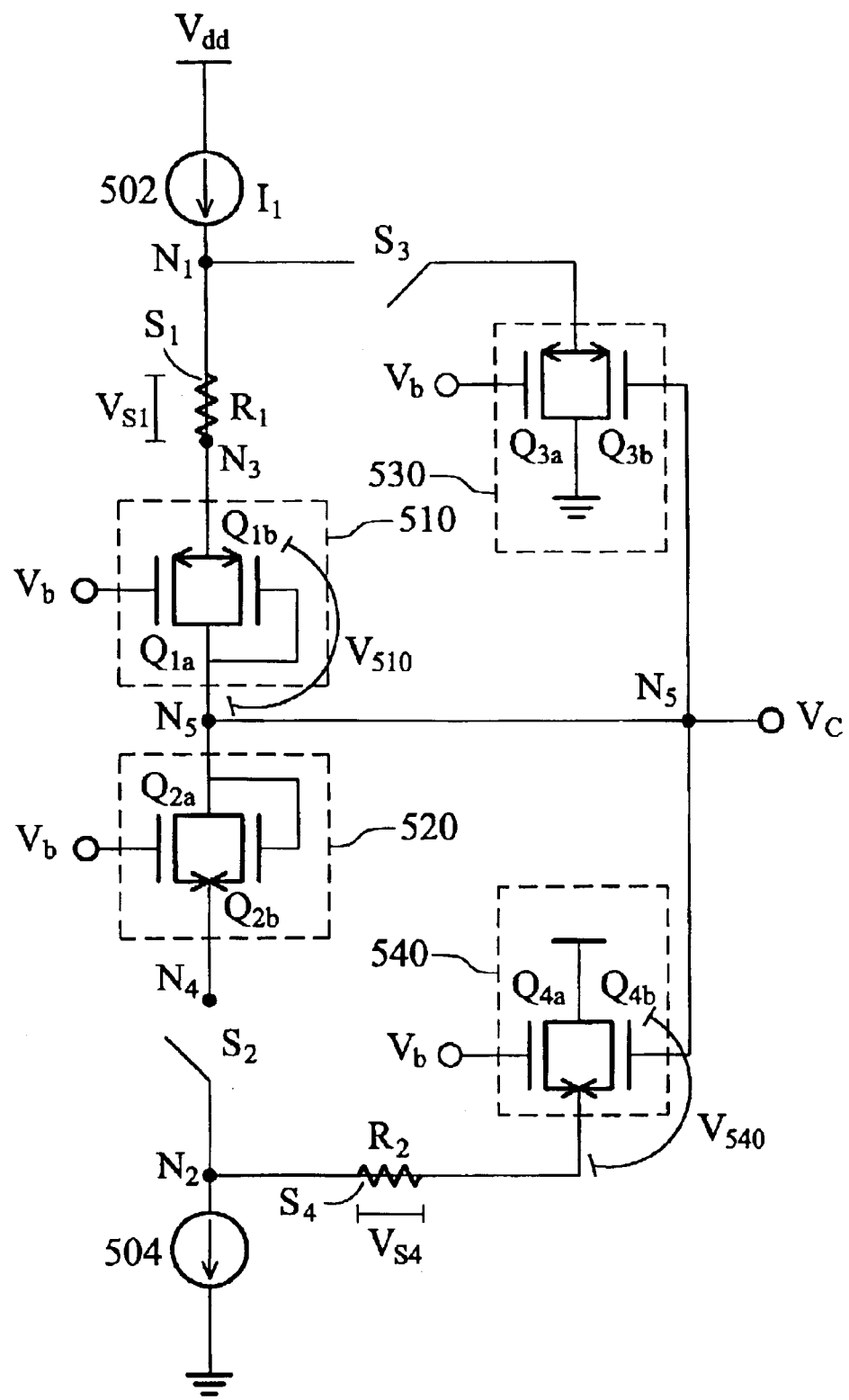
FIG. 5b is a circuit diagram illustrating the charge-pump circuit for charge-share when the switches S1 and S4 shown in FIG. 5a are in "On" state.
Figure 5C:
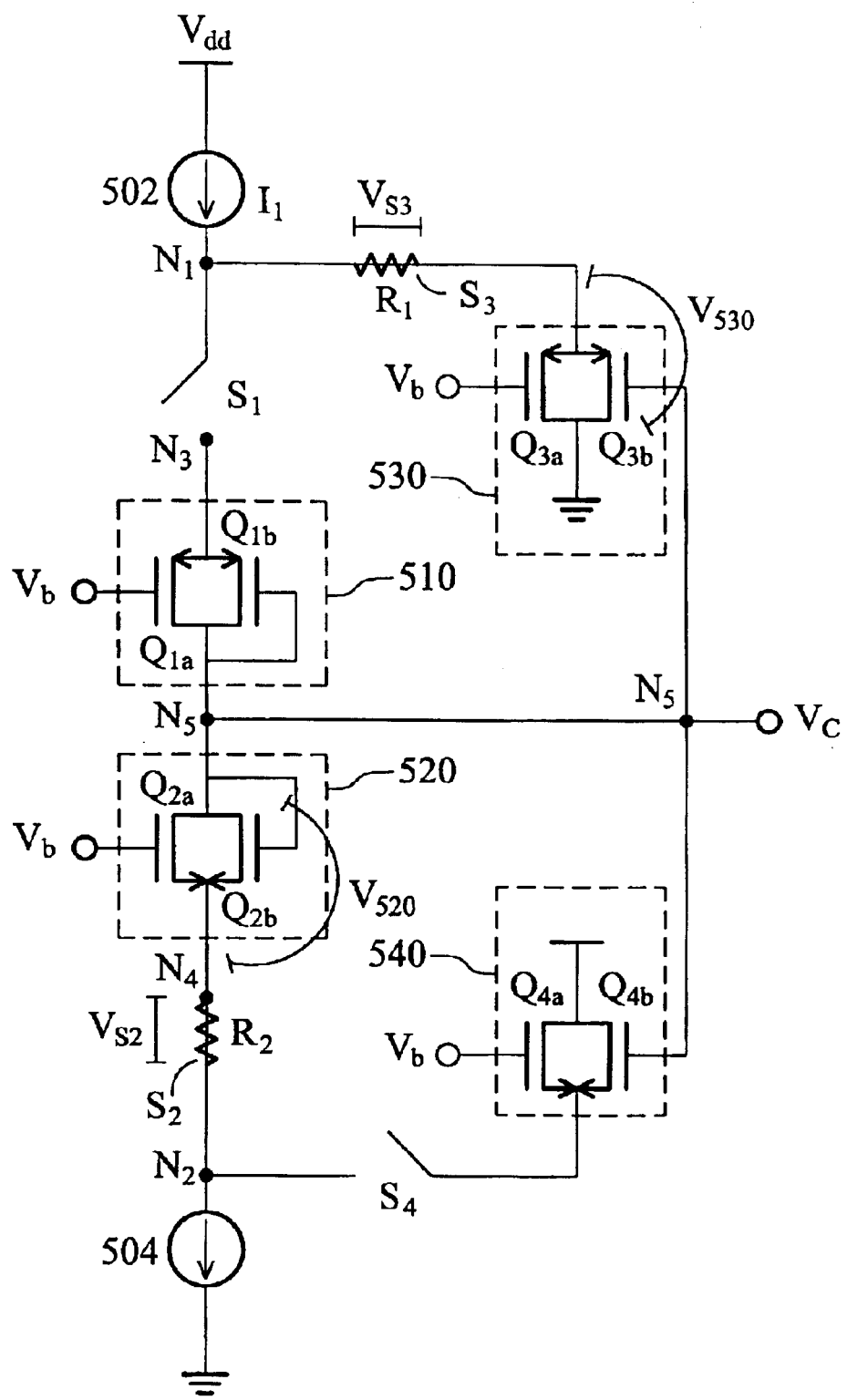
FIG. 5c is a circuit diagram illustrating the charge-pump circuit for charge-share when the switches S2 and S3 shown in FIG. 5a are in "On" state.

For a better understanding of the embodiment, reference is made to a detailed description to be read in conjunction with FIG. 5b and FIG. 5c.

FIG. 5b is a circuit diagram illustrating the charge-pump circuit for charge-share when the switches S1 and S4 shown in FIG. 5a are in "On" state. As shown in FIG. 5b, when the switch S4 is in "On" state, the output voltage $V_c$ on the node N5 is increased because the switch S1 is in "On" state. The voltage depleted in impedance $R_2$ of the switch S4 in "On" state is $V_{S4}$. A difference in voltage between a source and a gate of the transistor $Q_{4b}$ of the group of transistors 540 is $V_{540}$. Therefore, the voltage on the node N2 is $V_c-V_{S4}-V_{540}$. At this time, if the switch S2 changes from "Off" state to "On" state, the switch S4 will change from "On" state to "Off" state. The voltage on the node N2 is $V_c-V_{S4}-V_{540}$. Because the switch S2 is the same as the switch S4, the voltage depleted in impedance $R_2$ of the switch S2 in "On" state, i.e. $V_{S2}$, is equal to the voltage $V_{S4}$. The voltage on the node N4 is $V_c-V_{540}$. Because the transistor $Q_{2b}$ is the same as the transistor $Q_{4b}$ and the transistor $Q_{2a}$ is the same as the transistor $Q_{4a}$, the difference in voltage between a source and a gate of the transistor $Q_{2b}$ of the group of transistors 520, i.e. $V_{520}$, is equal to the voltage $V_{540}$. Thus, the voltage on the node N5 is still $V_c$. The charge-share problem does not occur.

FIG. 5c is a circuit diagram illustrating the charge-pump circuit for charge-share when the switches S2 and S3 shown in FIG. 5a are in "On" state. As shown in FIG. 5c, when the switch S3 is in "On" state, the output voltage $V_c$ on the node N5 is decreased because the switch S2 is in "On" state. The voltage depleted in impedance $R_1$ of the switch S3 in "On" state is $V_{S3}$. A difference in voltage between a source and a gate of the transistor $Q_{3b}$ of the group of transistors 530 is $V_{530}$. Therefore, the voltage on the node N1 is $V_c+V_{S3}+V_{530}$. At this time, if the switch S1 changes from "Off" state to "On" state, the switch S3 will change from "On" state to "Off" state. The voltage on the node N1 is $V_c+V_{S3}+V_{530}$. Because the switch S1 is the same as the switch S3, the voltage depleted in impedance $R_1$ of the switch S1 in "On" state, i.e. $V_{S1}$, is equal to the voltage $V_{S3}$. The voltage on the node N3 is $V_c+V_{530}$. Because the transistor $Q_{1b}$ is the same as the transistor $Q_{3b}$ and the transistor $Q_{1a}$ is the same as the transistor $Q_{3a}$, the difference in voltage between a source and a gate of the transistor $Q_{1b}$ of the group of transistors 510, i.e. $V_{510}$, is equal to the voltage $V_{530}$. Thus, the voltage on the node N5 is still $V_c$. The charge-share problem does not occur.

In the embodiment of the present invention, the groups of transistors 510, 520, 530, and 540, separately comprising a pair of transistors, are regarded as loads. In anther embodiment of the present invention, the groups of transistors, separately comprising one transistor, can be regarded as loads. If the groups of transistors separately comprising one transistor are used, however, the work range of the charge-pump circuit will be limited i.e. when the output voltage is close to $V_{dd}$ or 0, the charge-pump circuit cannot work. Therefore, in the preferred embodiment of the invention, the groups of transistors separately comprising a pair of transistors are regarded as loads. The output impedance of the current source is increased and the work range of the charge-pump circuit is not changed.

Figure 6:
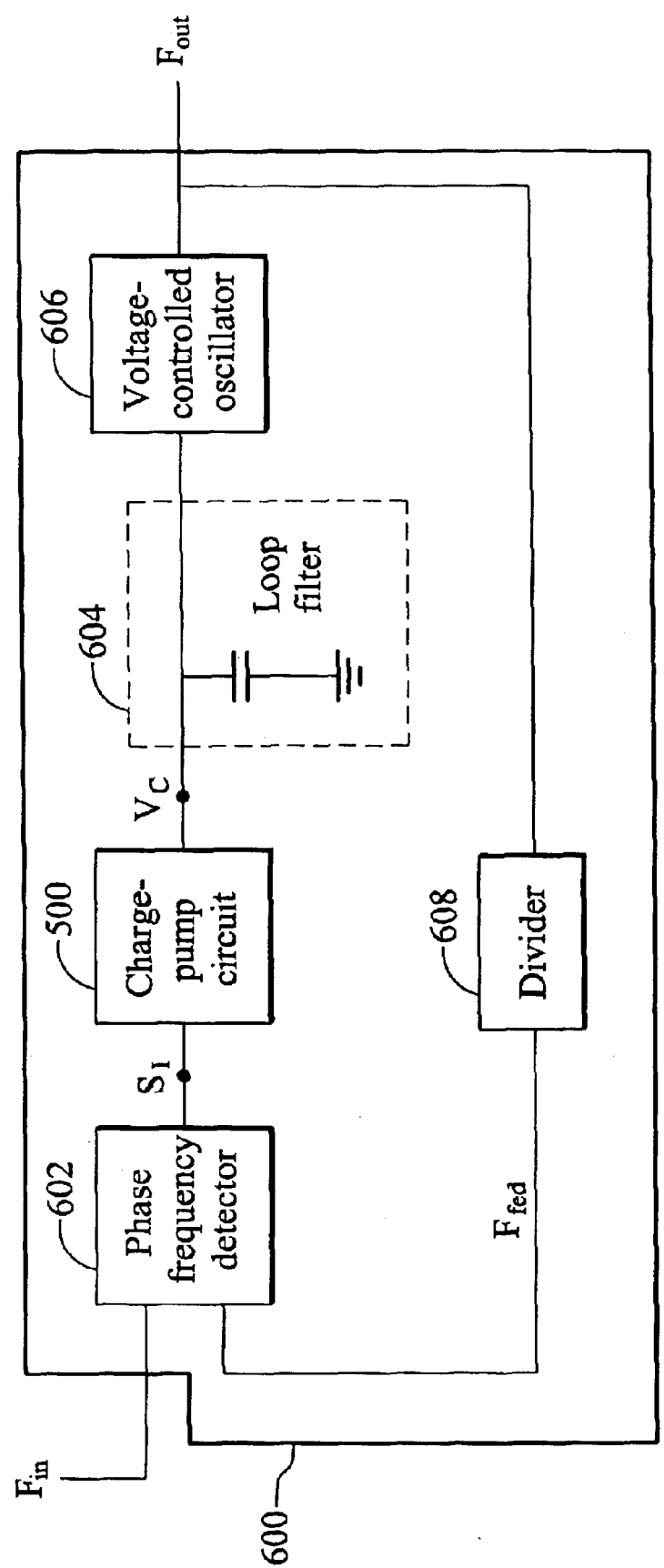

FIG. 6 is a block diagram illustrating a phase lock loop system comprising the charge-pump circuit for charge-share shown in FIG. 5a. The phase lock loop system 600 comprises a phase frequency detector 602, a charge-pump circuit 500, a loop filter 604, a voltage-controlled oscillator 606 and a divider 608. The phase frequency detector 602 receives a referenced clock $F_{in}$. A controlling signal $S_I$ is generated by the phase frequency detector 602.

The charge-pump circuit 500 is coupled to the phase frequency detector 602. The circuit diagram of the charge-pump circuit 500 refers to FIG. 5a. The controlling signal $S_I$ is input to the charge-pump circuit 500 to control the switches S1~S4. The output voltage $V_c$ is output from the charge-pump circuit 500. The loop filter 604 is coupled to an output terminal of the charge-pump circuit 500. When the switch S1 is in "On" state, the loop filter 604 is charged by the output voltage $V_c$. When the switch S2 is in "On" state, the loop filter 604 supplies the stored power to the group of transistors 520.

The voltage-controlled oscillator 606 is coupled to the charge-pump circuit 500. The voltage-controlled oscillator 606 is controlled by the output voltage $V_c$ and generates a required clock $F_{out}$ output. The required clock $F_{out}$ is fed to the divider 608. The divider 608 generates a feedback frequency $F_{feb}$. The feedback frequency $F_{feb}$ is fed back to the phase frequency detector 602.

Figure 4:
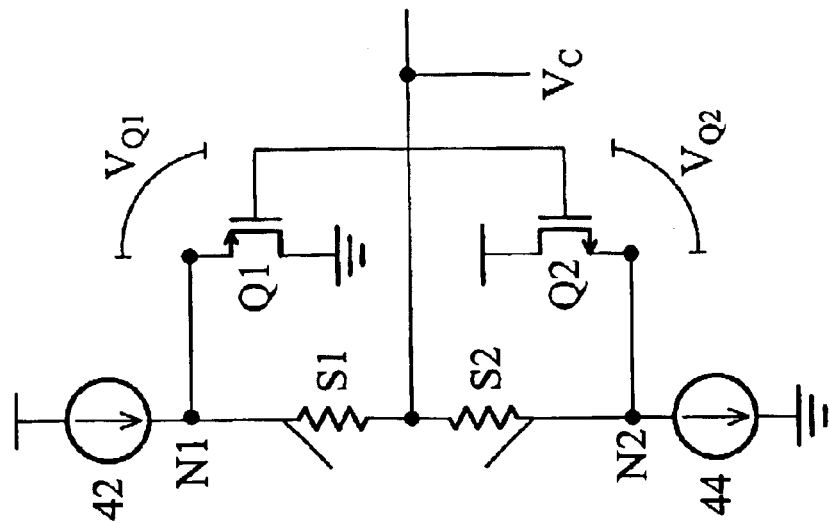
FIG. 4 is a circuit diagram illustrating a conventional charge-pump circuit for charge-share suppression with transistors.

FIGS. 7a~7h are schematic diagrams illustrating simulation results of two conventional charge-pump circuits (shown in FIG. 3 and FIG. 4) and the charge-pump circuit of the present invention (shown in FIG. 5). The X axis is time, in units of seconds (s). The Y axis is the output voltage Vc, in units of volts (V).

Figure 3:
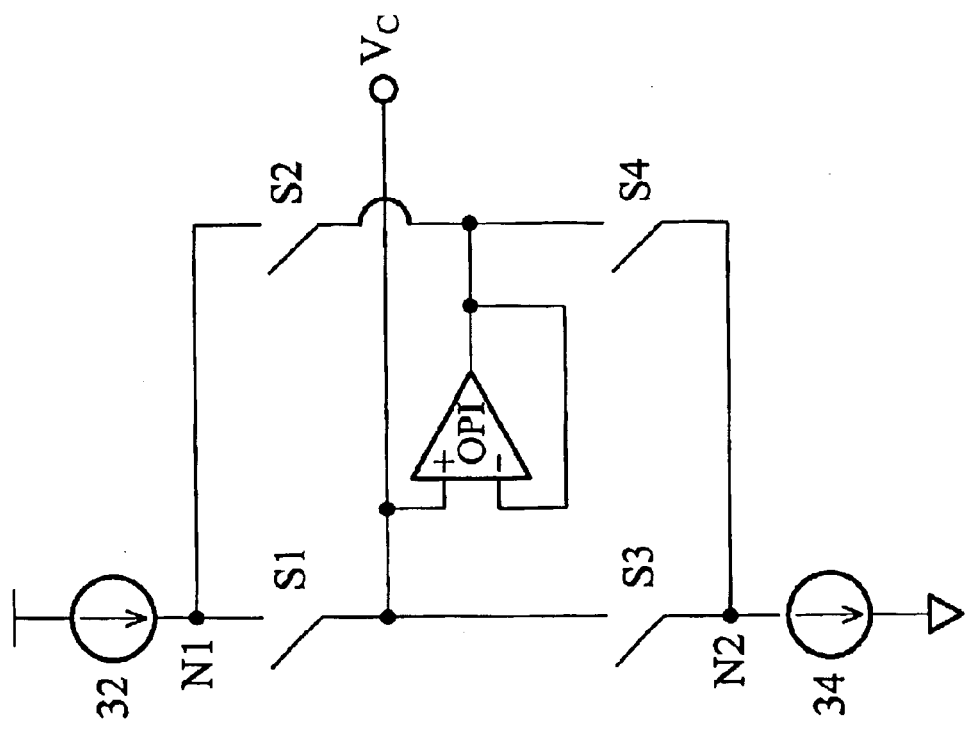
FIG. 3 is a circuit diagram illustrating a conventional charge-pump circuit for charge-share suppression with an operational amplifier.
Figure 7A:
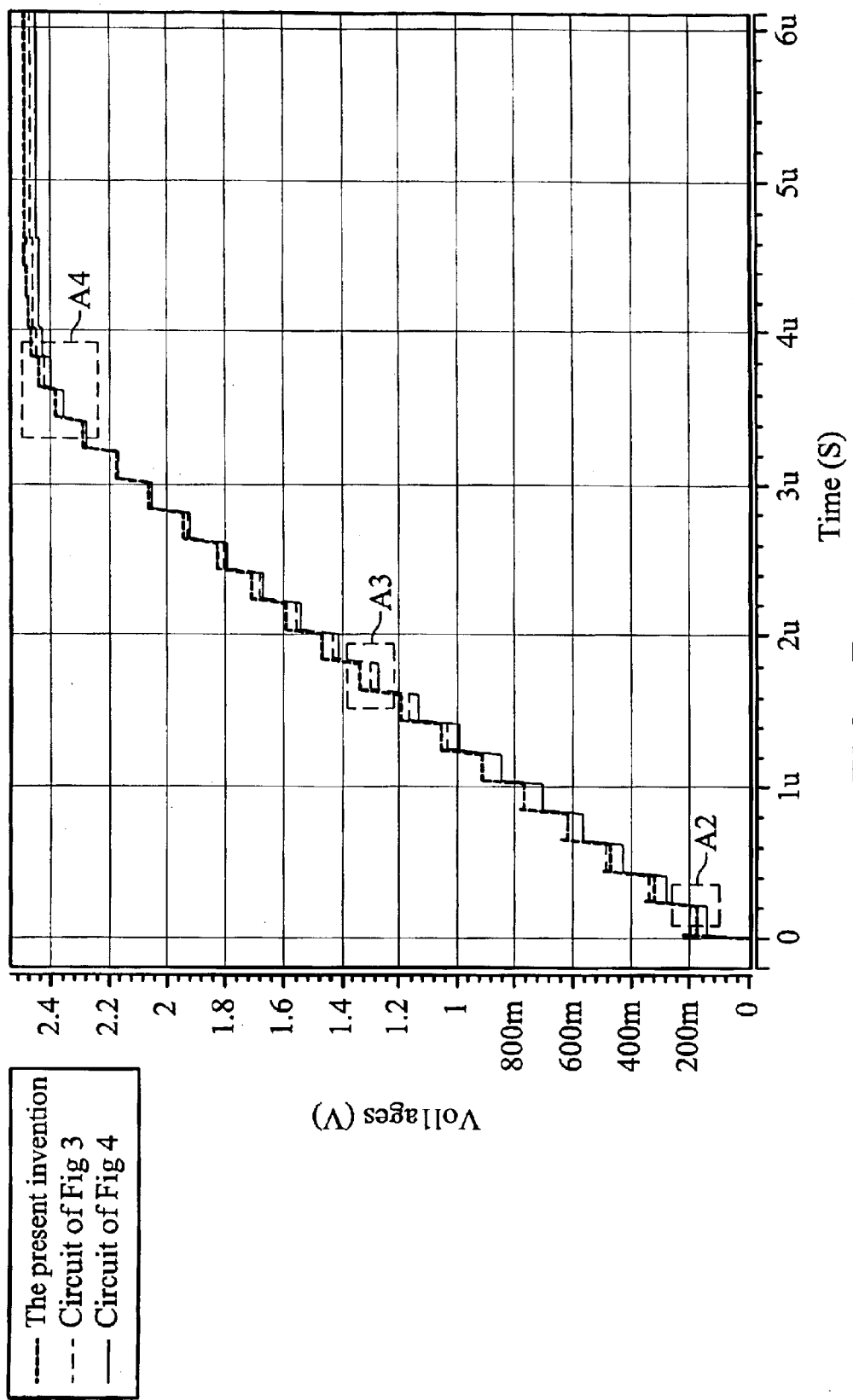
FIGS. 7a~7h are schematic diagrams illustrating simulation results of two conventional charge-pump circuits and the charge-pump circuit of the present invention.
Figure 7B:
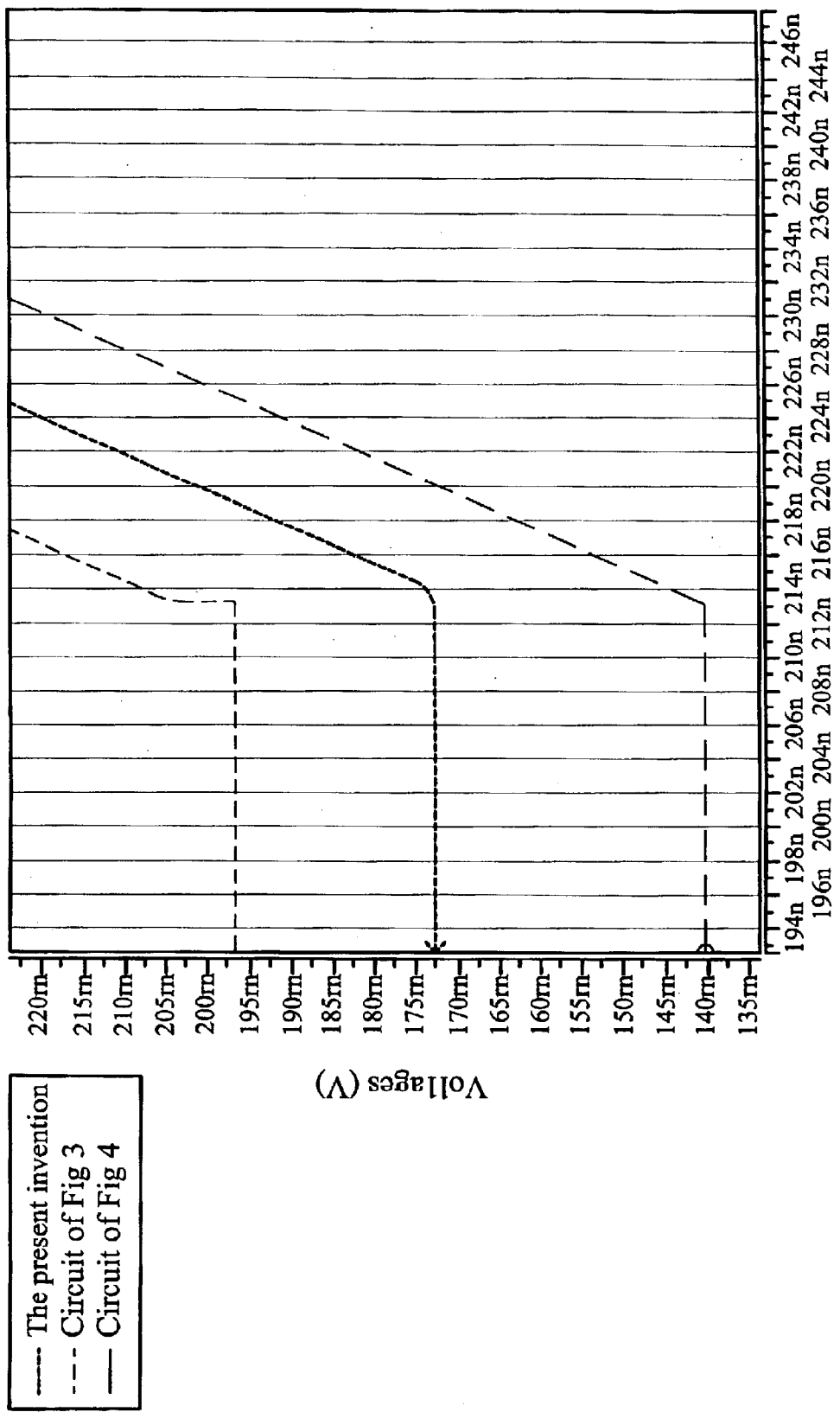
Figure 7C:
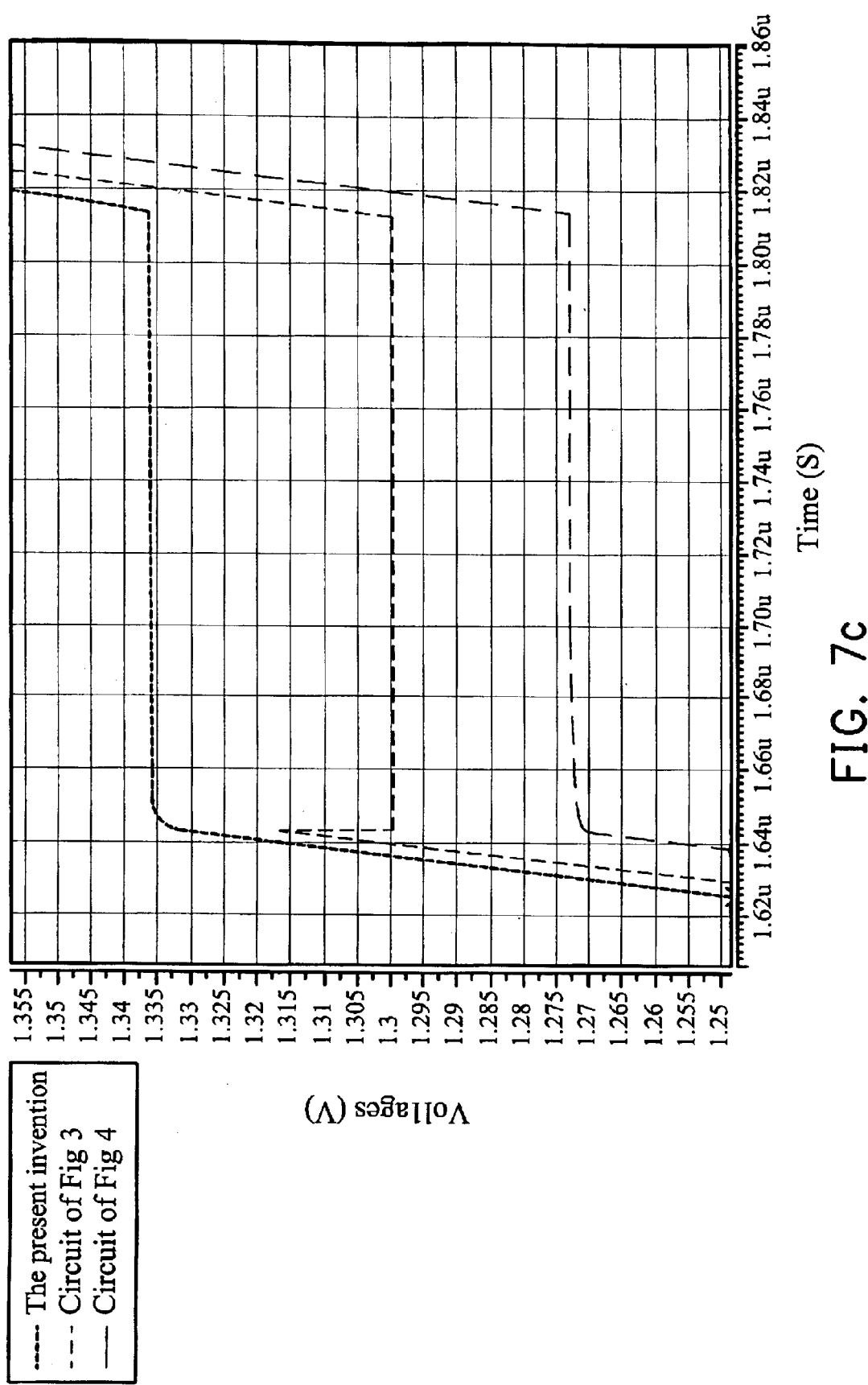
Figure 7D:
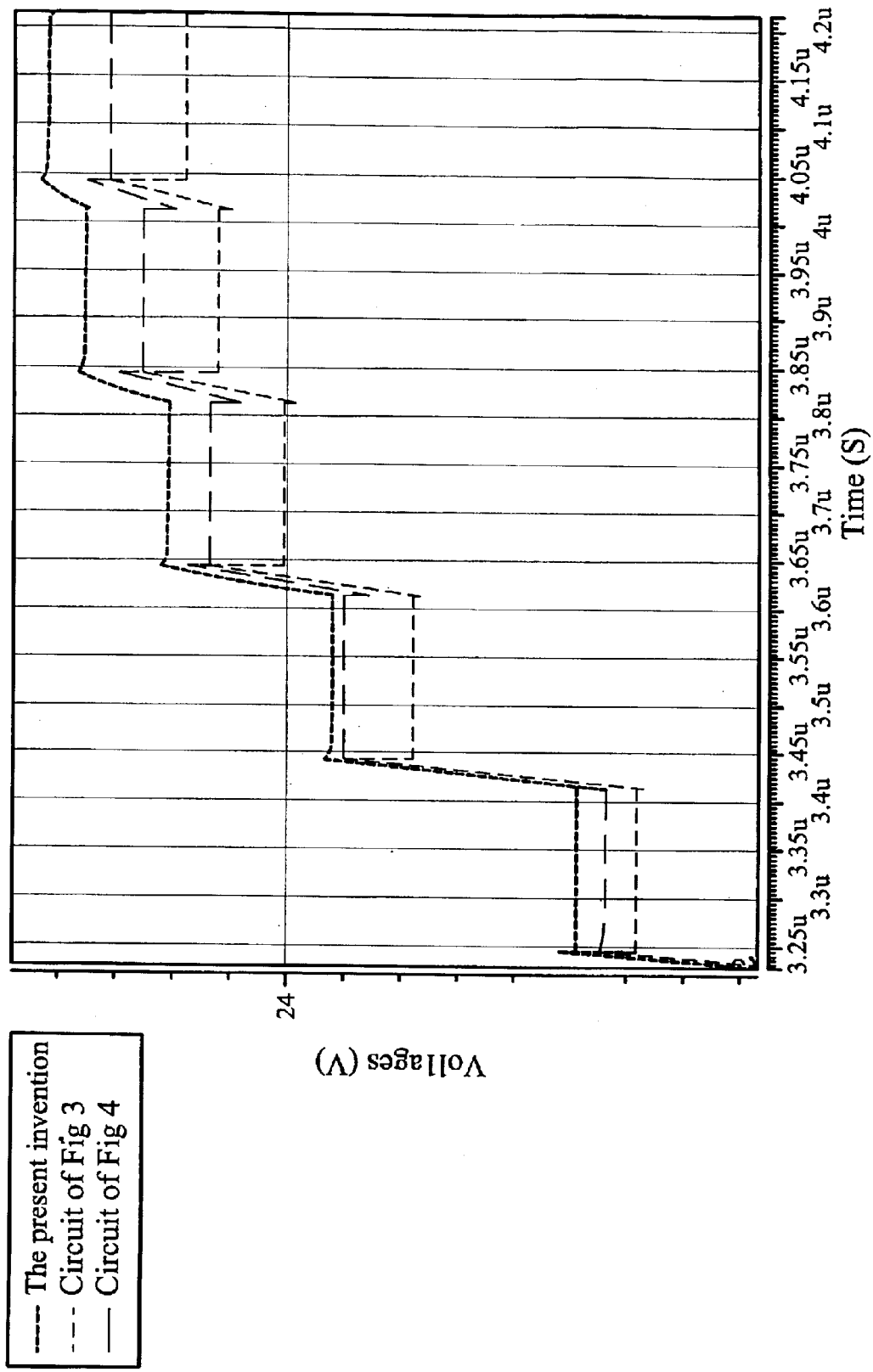

FIG. 7a shows the three kinds of charge-pump circuits can work between a high voltage (about 2.5 V) and a low voltage (close to 0 V) when the output voltage is increased due to charging. FIG. 7b illustrates simulation results of three kinds of charge-pump circuits when the output voltage of FIG. 7a is at the low voltage. FIG. 7c illustrates simulation results of three kinds of charge-pump circuits when the output voltage of FIG. 7a is one middle voltage. FIG. 7d illustrates simulation results of three kinds of charge-pump circuits when the output voltage of FIG. 7a is at the high voltage. Comparison between FIGS. 7b~7d, the charge-share problem does not occur in the charge-pump circuit of the present invention. When the output voltage of the conventional charge-pump circuit shown in FIG. 3 is close to high voltage, the charge-share problem occurs. However, the result of the charge-share suppression in the circuit of FIG. 3 completely depends upon the operational capacity of the operational amplifier. A fine design of the operational amplifier is preferred to the result of the charge-share suppression.

Figure 7E:
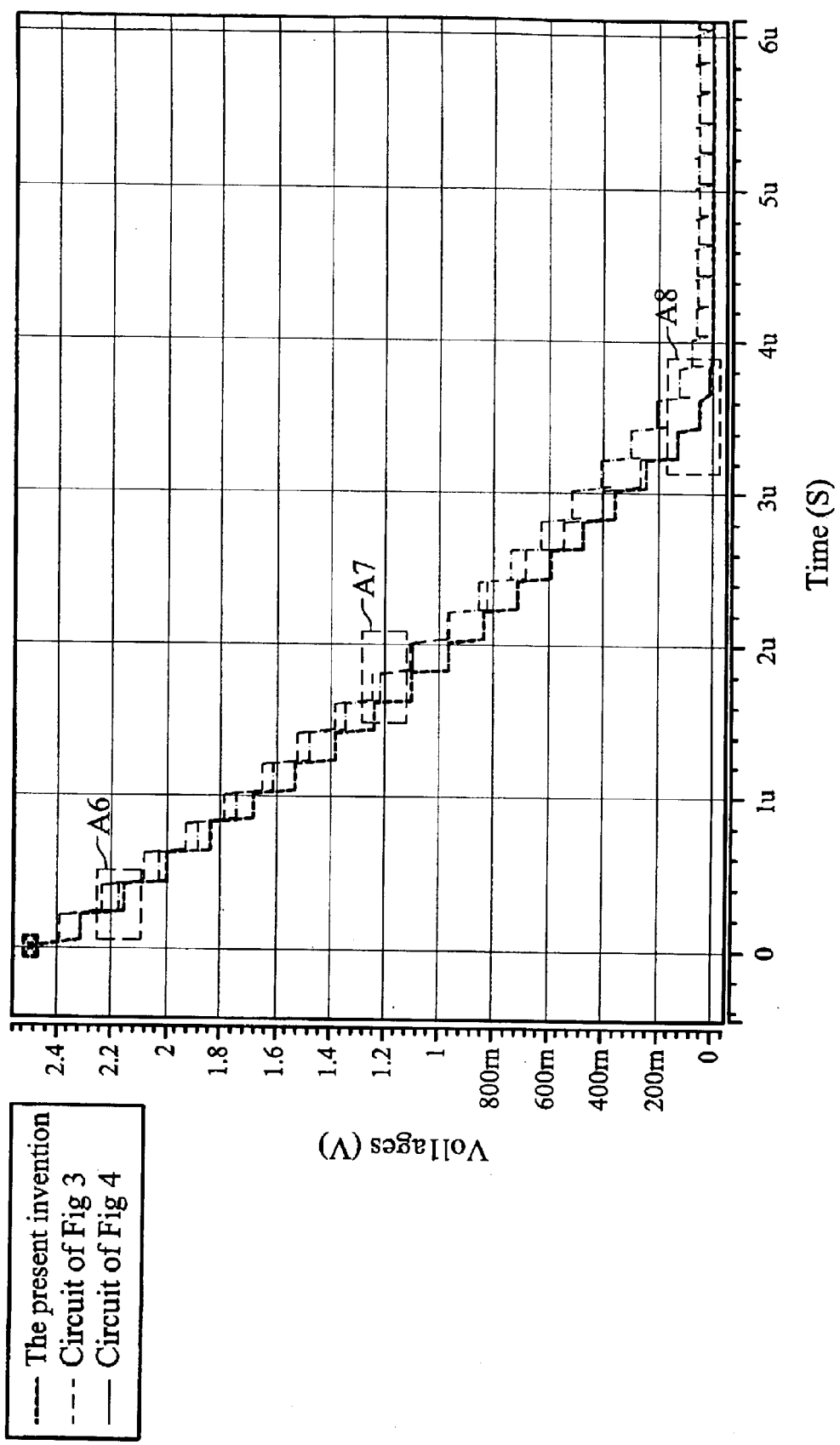
Figure 7F:
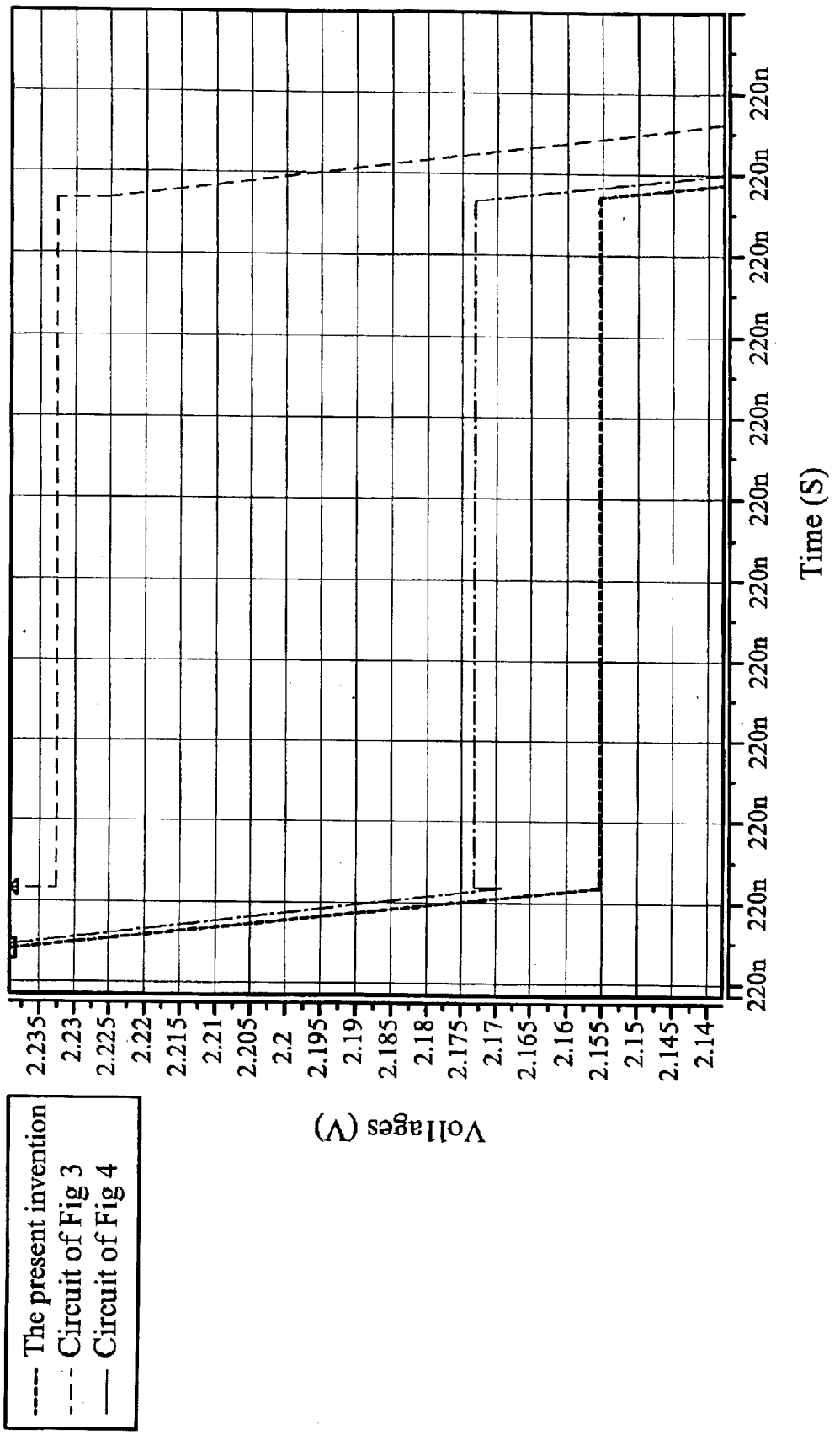
Figure 7G:
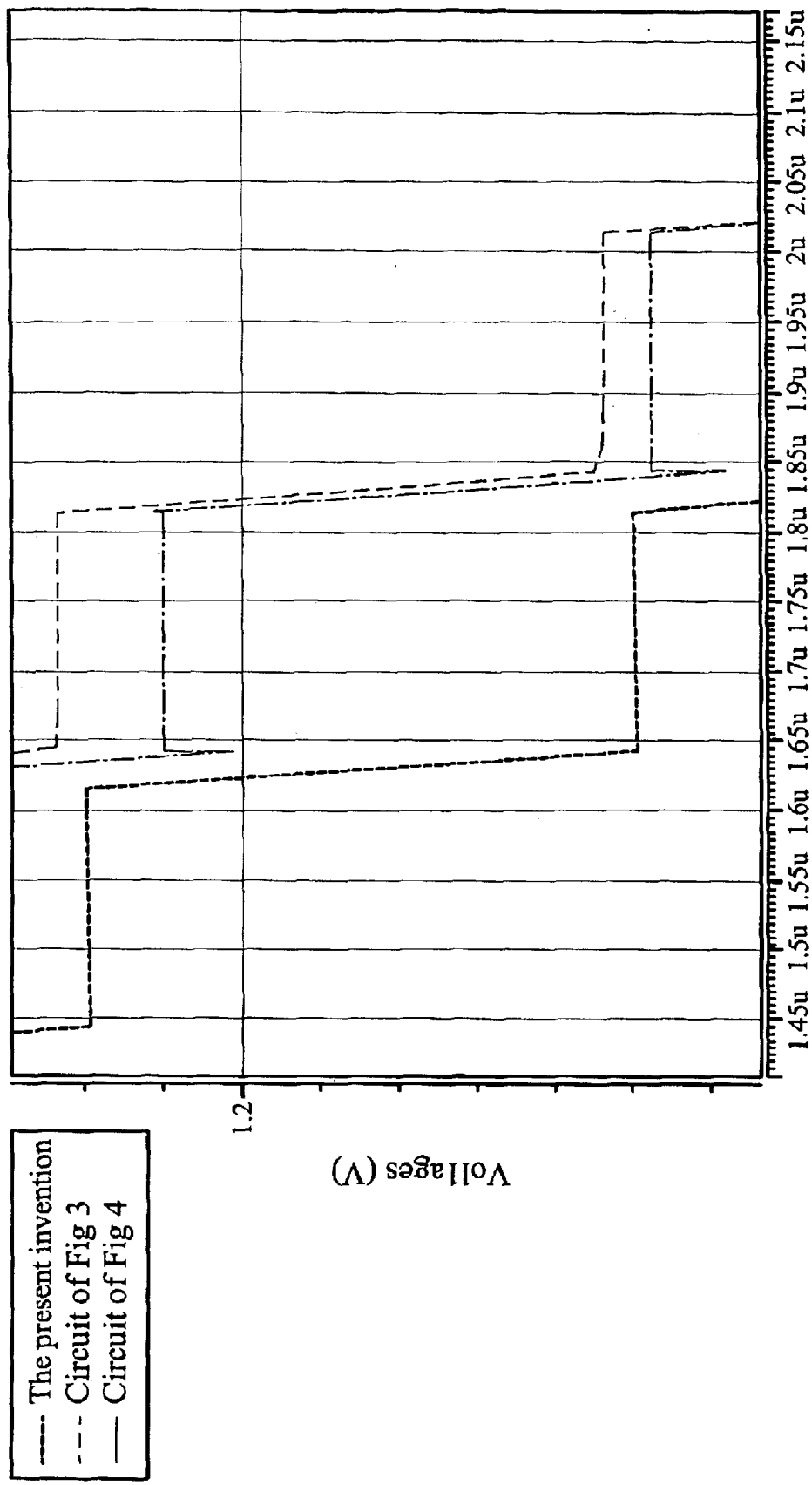
Figure 7H:
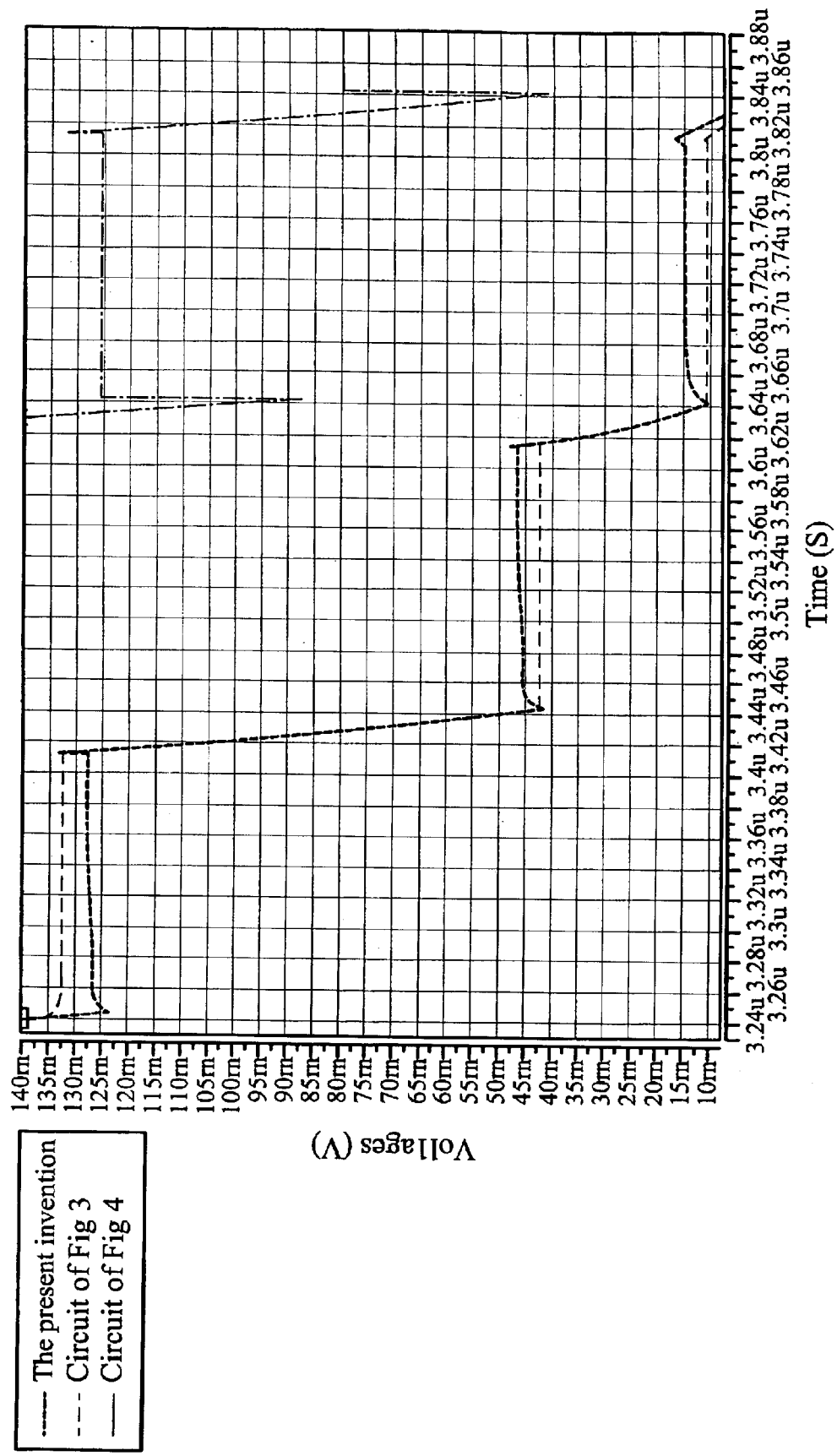
Figure 8:
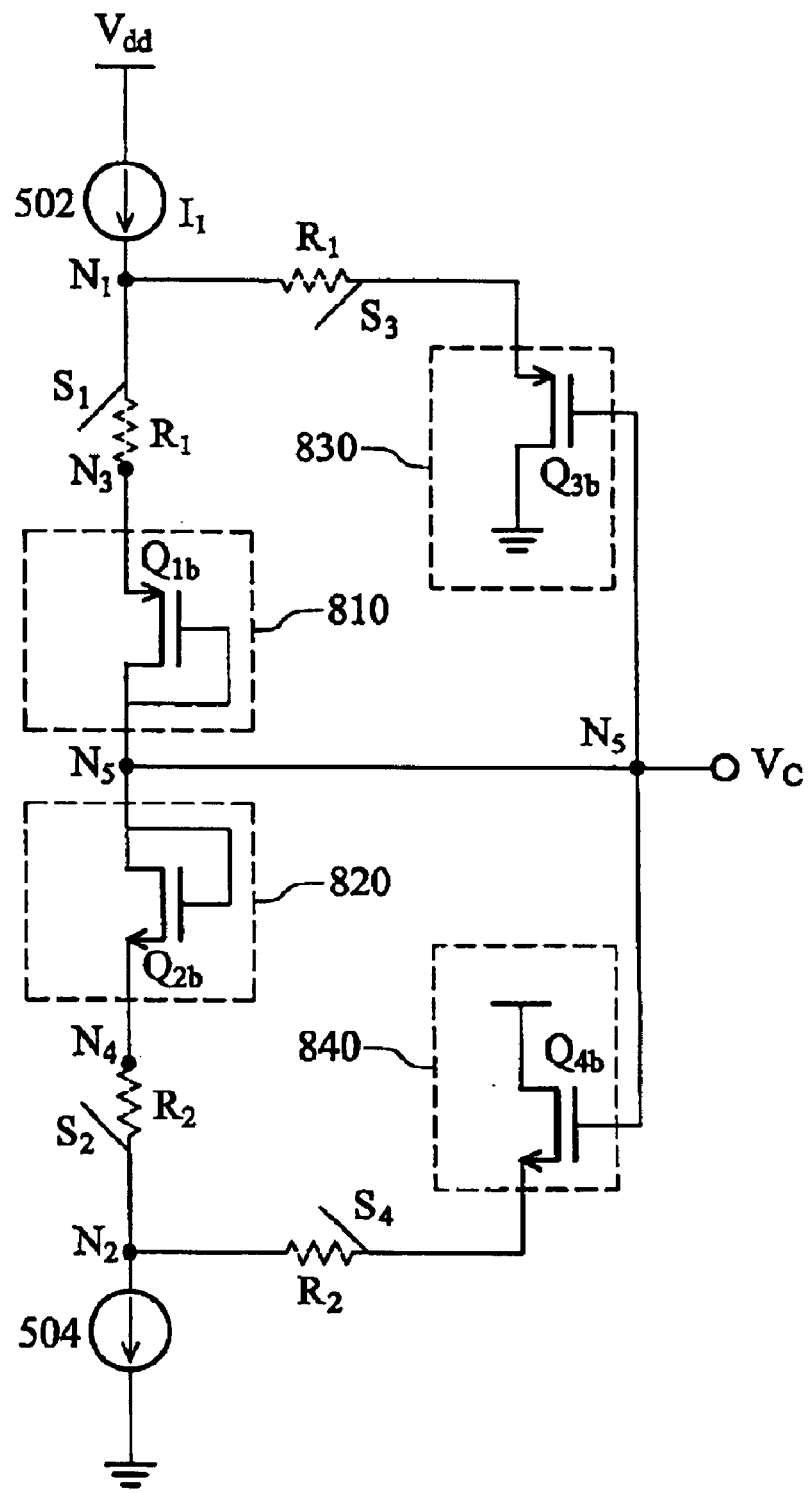
FIG. 8 is a circuit diagram illustrating a charge-pump circuit for charge-share suppression according to a second embodiment of the present invention. In the second embodiment, the charge-pump circuit is identical to the previous described charge-pump circuit shown in FIG. 5a, except that each of the loads 810, 820, 830, and 840 only comprises one transistor. Load 810 can be seemed as a diode load for the charge-pump circuit, which reduces the output impedance of the current source. In comparison to load 510 in FIG. 5, the load 810 has a lower output impedance, thus the work range of the charge-pump circuit is smaller to avoid the output voltage approaching $V_{dd}$ or 0.

FIG. 7e shows the three kinds of charge-pump circuits between a high voltage (about 2.5 V) and a low voltage (close to 0 V) when the output voltage is decreased because of discharge. FIG. 7f illustrates simulation results of three kinds of charge-pump circuits when the output voltage of FIG. 7a is at the high voltage. FIG. 7g illustrates simulation results of three kinds of charge-pump circuits when the output voltage of FIG. 7a is at one middle voltage. FIG. 7h illustrates simulation results of three kinds of charge-pump circuits when the output voltage of FIG. 7a is at the low voltage. Comparing FIGS. 7f~7h, the charge-share problem occurs in the conventional charge-pump circuit shown in FIG. 4. When the output voltage of the conventional charge-pump circuit shown in FIG. 3 is close to the high voltage, the charge-share problem occurs. The charge-share problem only occurs in the charge-pump circuit of the present invention, when the output voltage is close to the low voltage (below 100 mV) The problem of the charge-pump circuit is eliminated.

The present invention provides a charge-pump circuit for charge-share suppression without adding operational amplifiers, which decrease the difficulty of designing the charge-pump circuit, and with a feedback path to resolve the problems of influence on components by different procedures and environments.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A charge-pump circuit for charge-share suppression, comprising:
   a first current source for receiving a voltage from a voltage generator and providing a current output;
   a first switching element coupled between a first connecting node and an output terminal, status of which is controlled by an input signal;
   a first load coupled between the first switching element and the output terminal, receiving the current and outputting voltage at the output terminal when the first switching element is in "On" state;

a second switching element, the second switching element controlled by the input signal and opposite to the first switching element;

a second current source coupled between the second switching element and ground and coupled to the second switching element through a second connecting node;

a second load coupled between the second switching element and the output terminal, the second load receiving the output voltage when the second switching element is in "On" state;

a first feedback circuit for maintaining a constant relation between the output voltage and a voltage of the first node, not influenced by the status of the first and second switching elements; and a second feedback circuit for maintaining a constant relation between the output voltage and a voltage of the second node, not influenced by the status of the first and second switching elements;

wherein at least one of the feedback circuit further comprises:

a third load coupled between the output terminal and the ground, receiving the output voltage when the second switching element is in "On" state, wherein the components of the third load are the same as the components of the first load; and a third switching element coupled between the third load and the first current source, wherein a status of the third switching element is the same as the second switching element and an impedance of the third switching element in "On" state is the same as that of the first switching element in "On" state.

2. The charge-pump circuit of claim 1, wherein each of the first load, the second load, and the third load is composed of a transistor.

3. The charge-pump circuit of claim 1, wherein each of the first load, the second load, and the third load is composed of a pair of transistor.

4. A phase-locked loop system, comprising:

a phase frequency detect for receiving a clock and providing a control signal output;

a charge-pump circuit coupled to the phase frequency detect and controlled by the control signal, the charge-pump circuit producing an output voltage, comprising:

a first current source for receiving a voltage from a voltage generator and providing a current output;

a first switching element coupled between a first connecting node and an output terminal, status of which is controlled by an input signal;

a first load coupled between the first switching element and the output terminal, receiving the current and outputting voltage at the output terminal when the first switching element is in "On" state;

a second switching element, the second switching element controlled by the input signal and opposite to the first switching element;

a second current source coupled between the second switching element and ground and coupled to the second switching element through a second connecting node;

a second load coupled between the second switching element and the output terminal, the second load receiving the output voltage when the second switching element is in "On" state;

a first feedback circuit for maintaining a constant relation between the output voltage and a voltage of the first node, not influenced by the status of the first and second switching elements; and a second feedback circuit for maintaining a constant relation between the output voltage and a voltage of the second node, not influenced by the status of the first and second switching elements;

a loop filter coupled to the output terminal of the charge-pump circuit and charged by the output voltage when the first switching element is in "On" state, the loop filter discharging the output voltage to the second load;

a voltage-controlled oscillator, controlled by the output voltage from the charge-pump circuit and producing a required clock output; and a frequency divider for receiving the required clock, producing a feedback frequency feedback to the phase frequency detect;

wherein at least one of the feedback circuit in the charge-pump circuit further comprises:

a third load coupled between the output terminal and the ground, receiving the output voltage when the second switching element is in "On" state, wherein the components of the third load are the same as the components of the first load; and a third switching element coupled between the third load and the first current source, wherein a status of the third switching element is the same as the second switching element and an impedance of the third switching element in "On" state is the same as that of the first switching element in "On" state.

5. The phase-locked loop system of claim 4, wherein each of the first load, the second load, and the third load is composed of a transistor.

6. The phase-locked loop system of claim 4, wherein each of the first load, the second load, and the third load is composed of a pair of transistor.

* * * * *